United States Patent
Kim et al.

(10) Patent No.: US 6,790,748 B2
(45) Date of Patent: Sep. 14, 2004

(54) THINNING TECHNIQUES FOR WAFER-TO-WAFER VERTICAL STACKS

(75) Inventors: Sarah E. Kim, Portland, OR (US); R. Scott List, Beaverton, OR (US); Mauro J. Kobrinsky, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 71 days.

(21) Appl. No.: 10/326,206

(22) Filed: Dec. 19, 2002

(65) Prior Publication Data

US 2004/0121556 A1 Jun. 24, 2004

(51) Int. Cl.[7] .......................... H01L 21/76; H01L 21/46; H01L 27/01
(52) U.S. Cl. .................... 438/459; 438/406; 438/977
(58) Field of Search .................. 438/405, 455–459, 438/967, 977; 257/347

(56) References Cited

U.S. PATENT DOCUMENTS

| | | | |
|---|---|---|---|
| 5,656,553 A | * | 8/1997 | Leas et al. ................. 438/15 |
| 6,417,075 B1 | | 7/2002 | Haberger et al. |
| 6,645,832 B2 | * | 11/2003 | Kim et al. ................. 438/456 |
| 6,686,642 B2 | * | 2/2004 | Regan et al. .............. 257/521 |

* cited by examiner

*Primary Examiner*—Kamand Cuneo
*Assistant Examiner*—Asok Kumar Sarkar
(74) *Attorney, Agent, or Firm*—Rob G. Winkle

(57) ABSTRACT

Methods for thinning wafer-to-wafer vertical stacks in the fabrication of stacked microelectronic devices. The methods include physically removing unsupported portions of a wafer to be thinned in the vertical stack. The removal of the unsupported portions substantially eliminates potential cracking and chipping of the wafer, which can occur during the thinning process when the unsupported portions exist.

22 Claims, 8 Drawing Sheets

THINNING TECHNIQUES FOR WAFER-TO-WAFER VERTICAL STACKS

BACKGROUND OF THE INVENTION

1. Field of the Invention

The present invention relates generally to the manufacture of microelectronic devices. In particular, the present invention relates to a method of thinning a wafer-to-wafer vertical stack, which prevents edge chipping and/or cracking.

2. State of the Art

Greater packaging density of microelectronic devices is an ongoing goal of the computer industry. One method of increasing the density of microelectronic devices is to stack the individual microelectronic dice within these devices. One method of fabricating a stacked microelectronic device is to fabricate integrated circuitry on active surfaces of individual microelectronic wafers, stack them, then dice the stacked wafers into individual stacked microelectronic devices. FIG. 10 illustrates a first microelectronic wafer 202 having an active surface 204 and an opposing back surface 206. The active surface 204 includes integrated circuitry (illustrated generically as an integrated circuitry layer 208 within the illustrated dash lines) which is formed in the first microelectronic wafer 202 less than about 10 microns deep into the first microelectronic wafer 202. This integrated circuitry layer 208 is the functional area of the first microelectronic wafer 202. As will be understood by those skilled in the art, the microelectronic wafer 202 may be about 700 and 800 microns thick.

As shown in FIG. 11, an interconnect layer 212 is formed on the first microelectronic wafer active surface 206. The interconnect layer 212 may comprise multiple layers of conductive traces (not shown) separated by dielectric material layers (not shown). The first microelectronic wafer interconnect layer 212 provides routes for electrical communication between integrated circuit components within the integrated circuits and between integrated circuit components and external devices (not shown). As further shown in FIG. 11, the structure includes an exclusion zone 238 around the outer edge 210 of the first microelectronic wafer 202. The exclusion zone 238, usually between about 2 and 3 mm width, is necessary for uniform current distribution into a seed layer (not shown) for electroplating processes during the fabrication. Thus, any material used in during fabrication (e.g., photoresist, etc.), which falls within the exclusion zone 238 is removed (e.g., edge bead removal processes, etc.).

As shown in FIG. 12, a second microelectronic wafer 216 is provided, which also has an active surface 218, an integrated circuitry layer 222, and an interconnect layer 224 disposed thereon. The first microelectronic wafer interconnect layer 212 is aligned with the second microelectronic wafer interconnect layer 224 and attached using an electrically isolated metal bonding technique, as will be understood by those skilled in the art. The attachment of the first microelectronic wafer interconnect layer 212 and the second microelectronic wafer interconnect layer 224 may electrically interconnect the first microelectronic wafer integrated circuitry layer 208 and the second microelectronic wafer integrated circuitry layer 222.

Although the 700 to 800 micron thickness of the first microelectronic wafer 202 is required for the fabrication of the first microelectronic wafer integrated circuit layer 208, only the first microelectronic wafer integrated circuitry layer 208 is functional (it is, of course, understood that the second microelectronic wafer integrated circuitry layer 216 is also functional). Thus, after the fabrication of the first microelectronic wafer integrated circuit layer 208 and the first microelectronic wafer interconnection layer 212, a substantial amount of the first microelectronic wafer 202 may be removed (i.e., "thinned") without affecting the first microelectronic wafer integrated circuitry layer 208. Thinning a micro-electronic wafer makes it possible to route input-output signals, power, and ground to and from the integrated circuitry layer to the back surface of the microelectronic wafer, as will be discussed.

As shown in FIG. 13, the first microelectronic wafer 202 is thinned to a thickness of between about 10 and 100 microns forming a thinned back surface 226. A plurality of conductive vias 228 are formed to extend from the first microelectronic wafer thinned back surface 226 to the first microelectronic wafer integrated circuitry layer 208 to make electrical connections therewith, as shown in FIG. 14. A plurality of interconnect devices 232, such as solder balls, are then attached to the plurality of conductive vias 228 at the first microelectronic wafer thinned back surface 226, as shown in FIG. 15, to form a stacked wafer structure 234. The stacked wafer structure 234 may then be diced or singular, such as with a wafer saw or a laser (not shown) to form discrete packages 236, as shown in FIG. 16.

As previously discussed, the first and second microelectronic wafers 202, 216 each include exclusion zones 238 and 240, respectively, resulting in a portion 250 of the first microelectronic wafer 202 being unsupported. Thus, when the first microelectronic wafer 202 is thinned, the unsupported portion 250 is susceptible to chipping and cracking. As shown in FIG. 17, if the unsupported portion 250 (see FIGS. 13 and 14) chips off during thinning, the chip 242 can extend into the integrated circuitry layer 212, which can damage or destroy the functionality thereof. As shown in FIG. 18, if the unsupported portion 250 (see FIGS. 13 and 14) flexes during thinning, cracks 244 can propagate and extend into the integrated circuitry layer 208 also damaging or destroying the functionality thereof. Furthermore, chips and cracks may also facilitate contaminant incursion during subsequent processing, which may also damage or destroy the functionality of the integrated circuitry layer 208.

Therefore, it would be advantageous to develop methods for fabricating stacked microelectronic device, which reduces or substantially chipping and/or cracking of the microelectronic wafers during a thinning process.

BRIEF DESCRIPTION OF THE DRAWINGS

While the specification concludes with claims particularly pointing out and distinctly claiming that which is regarded as the present invention, the advantages of this invention can be more readily ascertained from the following description of the invention when read in conjunction with the accompanying drawings in which:

FIG. 17 illustrates a stacked wafer structure having a chip therein, as known in the art; and.

DETAILED DESCRIPTION OF THE ILLUSTRATED EMBODIMENT

Figure 1:
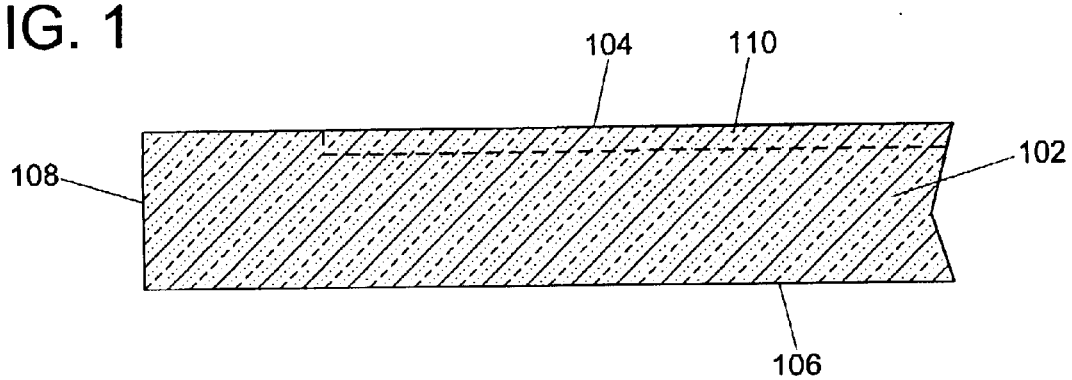
FIG. 1 illustrates a side cross-sectional view of a first microelectronic wafer, according to the present invention.

In the following detailed description, reference is made to the accompanying drawings that show, by way of illustration, specific embodiments in which the invention may be practiced. These embodiments are described in sufficient detail to enable those skilled in the art to practice the invention. It is to be understood that the various embodiments of the invention, although different, are not necessarily mutually exclusive. For example, a particular feature, structure, or characteristic described herein, in connection with one embodiment, may be implemented within other embodiments without departing from the spirit and scope of the invention. In addition, it is to be understood that the location or arrangement of individual elements within each disclosed embodiment may be modified without departing from the spirit and scope of the invention. The following detailed description is, therefore, not to be taken in a limiting sense, and the scope of the present invention is defined only by the appended claims, appropriately interpreted, along with the full range of equivalents to which the claims are entitled. In the drawings, like numerals refer to the same or similar functionality throughout the several views.

The present invention includes methods for thinning a wafer-to-wafer vertical stack, also known as a stacked wafer structure. In particular, the present invention including removing unsupported portions of one wafer to be thinned in the vertical stack. The removal of the unsupported portions eliminates potential cracking and chipping, which can occur during the thinning process when the unsupported portions exist.

FIGS. 1–10 illustrate a method of fabricating a stacked microelectronic device. FIG. 1 illustrates a first microelectronic wafer 102 having an active surface 104, a back surface 106 (opposing said active surface 104), and at least one edge 108. The first microelectronic wafer active surface 104 includes integrated circuitry components (illustrated generically as an integrated circuitry layer 110 within the illustrated dash lines), which are formed in the first microelectronic wafer 102 less than about 10 microns deep from the first microelectronic wafer active surface 104 into the first microelectronic wafer 102. This first microelectronic wafer integrated circuitry layer 10 is the functional area of the first microelectronic wafer 102. As will be understood by those skilled in the art, the first microelectronic wafer 102 may be between about 700 and 800 microns thick and may include any substrate capable of having integrated circuitry formed therein, including but not limited to, silicon, silicon-on-insulator, germanium, indium antimonide, lead telluride, indium arsenide, indium phosphide, gallium arsenide, or gallium antimonide. It is, of course, understood the integrated circuitry of the first microelectronic wafer integrated circuitry layer 110 may be any circuitry, including but not limited to, circuitry used in central processing units (CPUs), chipsets, memory devices, ASICs, and the like.

Figure 2:
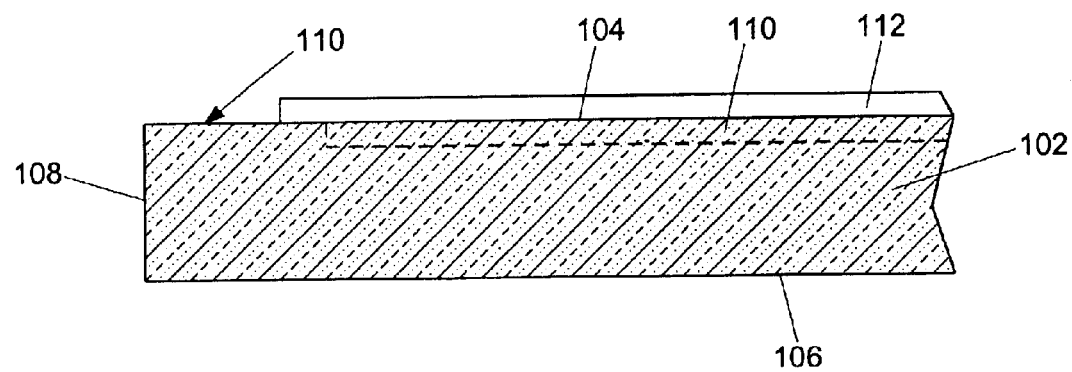
FIG. 2 illustrates a side cross-sectional view of an interconnection layer formed on the first microelectronic wafer of FIG. 1, according to the present invention.

As shown in FIG. 2, an interconnect layer 112 is formed on the first microelectronic wafer active surface 104 by techniques known in the art. The first microelectronic wafer interconnect layer 112 may comprise multiple conductive traces (not shown) separated by a plurality of dielectric material layers (not shown). The first microelectronic wafer interconnect layer 112 provides routes for electrical communication between integrated circuit components within the integrated circuits and between integrated circuit components and external devices (not shown). As further shown in FIG. 2, the structure includes an exclusion zone 115 around the outer edge 108 of the first microelectronic wafer 102. The exclusion zone 115, usually between about 2 and 3 mm width, is necessary for uniform current distribution into a seed layer (not shown) for electroplating processes during the fabrication. Thus, any material used in during fabrication (e.g., photoresist, etc.), which falls within the exclusion zone 115 is removed (e.g., edge bead removal processes, etc.).

Figure 3:
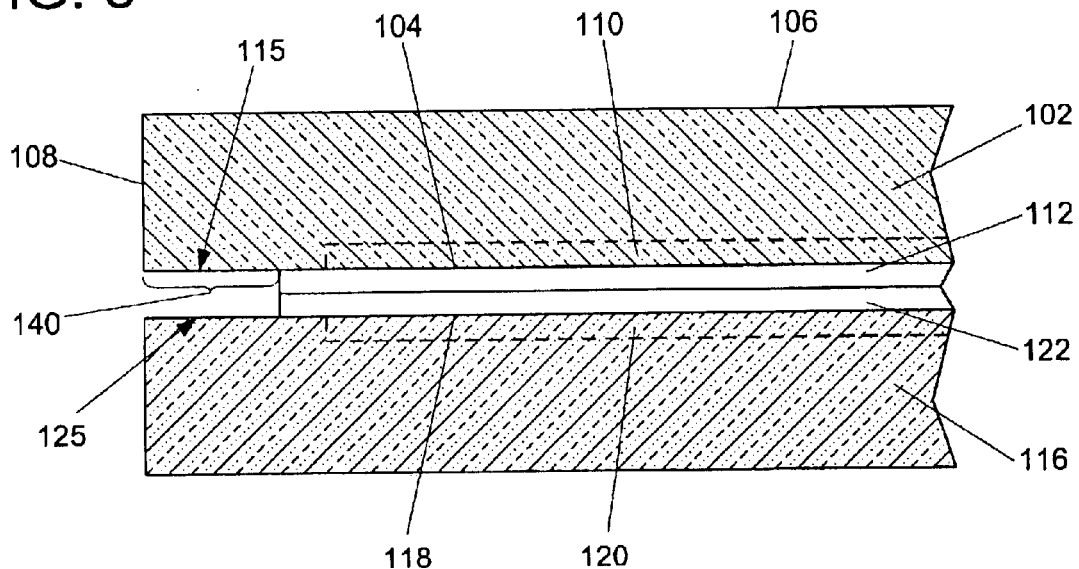
FIG. 3 illustrates a side cross-sectional view of the first microelectronic wafer of FIG. 2 aligned and attached to the second microelectronic wafer, according to the present invention.

As shown in FIG. 3, a second microelectronic wafer 116 is provided, which also has an active surface 118, an integrated circuitry layer 120, an exclusion zone 125, and an interconnect layer 122 disposed thereon. The first microelectronic wafer interconnect layer 112 is aligned with the second microelectronic wafer interconnect layer 122 and attached thereto. The attachment is preferably achieved using an electrically isolated metal bonding technique, as will be understood by those skilled in the art. The attachment of the first microelectronic wafer interconnect layer 112 and the second microelectronic wafer interconnect layer 122 may electrically interconnect the first microelectronic wafer integrated circuitry layer 110 and the second microelectronic wafer integrated circuitry layer 120. It is, of course, understood the integrated circuitry of the second microelectronic wafer integrated circuitry layer 120 may be any circuitry, including but not limited to, circuitry used in central processing units (CPUs), chipsets, memory devices, ASICs, and the like.

Figure 4:
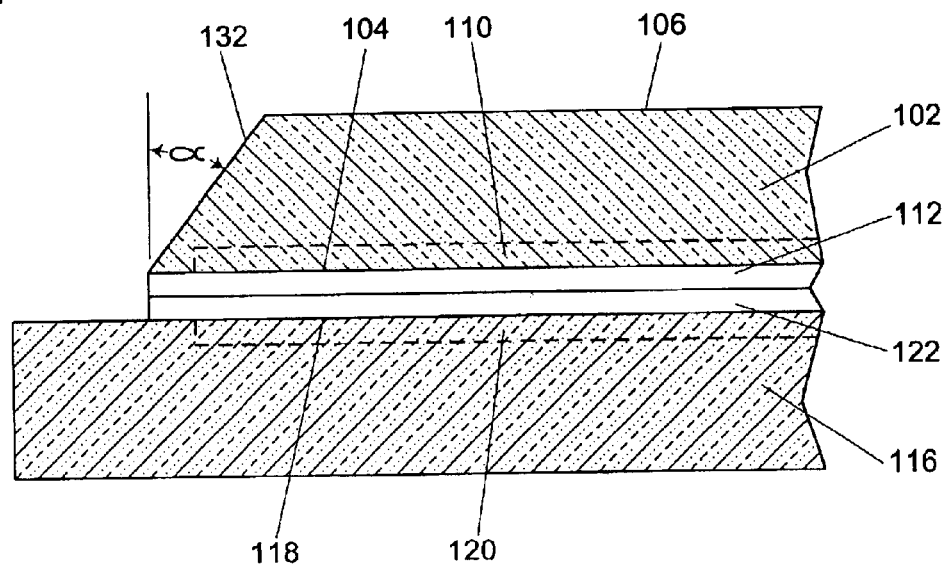
FIG. 4 illustrates a side cross-sectional view of an unsupported portion of the first microelectronic wafer aligned having been removed, according to the present invention.
Figure 5:
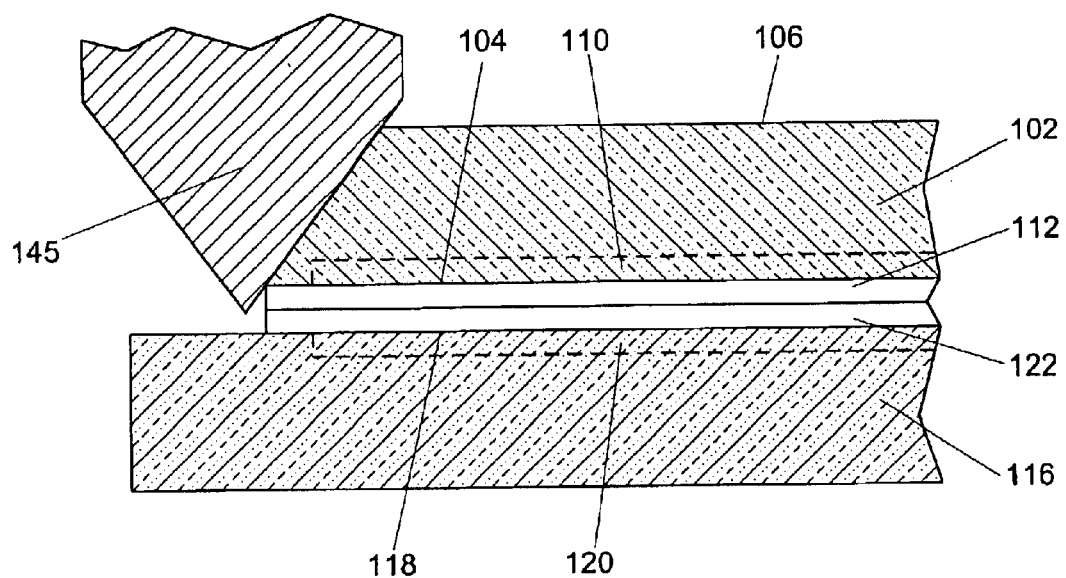
FIG. 5 illustrates a side cross-sectional view of a grinding wheel removing the unsupported portion of the first microelectronic wafer, according to the present invention.

As previously discussed, the first microelectronic wafer 102 and second microelectronic wafer 122 each include exclusion zones 115 and 125, respectively, resulting in a portion 140 of the first microelectronic wafer 102 being unsupported. Thus, to help prevent potential chipping and cracking during a subsequent thinning step, the first microelectronic wafer unsupported portion 140 is substantially, physically removed to form an abraded edge 132, as shown in FIG. 4. The physical removal of the first microelectronic wafer unsupported portion 130 is preferably accomplished by grinding, as shown in FIG. 5, wherein a grinding wheel 145 is placed against the first microelectronic wafer unsupported portion 140. The grinding is preferably accomplished using a typical grinding wheel available from Strasbaugh (San Luis Obispo, Calif. USA), Disco Corporation (Tokyo, Japan), Okamoto Corporation (Buffalo Grove, Ill., USA), Tokyo Seimitsu Co., Ltd. (Tokyo, Japan) or any other grinding company offering a bulk grinder. The grinding may be performed such that the abraded edge 132 is formed having a beveled angle □ of between about 0 to 60 degrees is formed.

Figure 6:
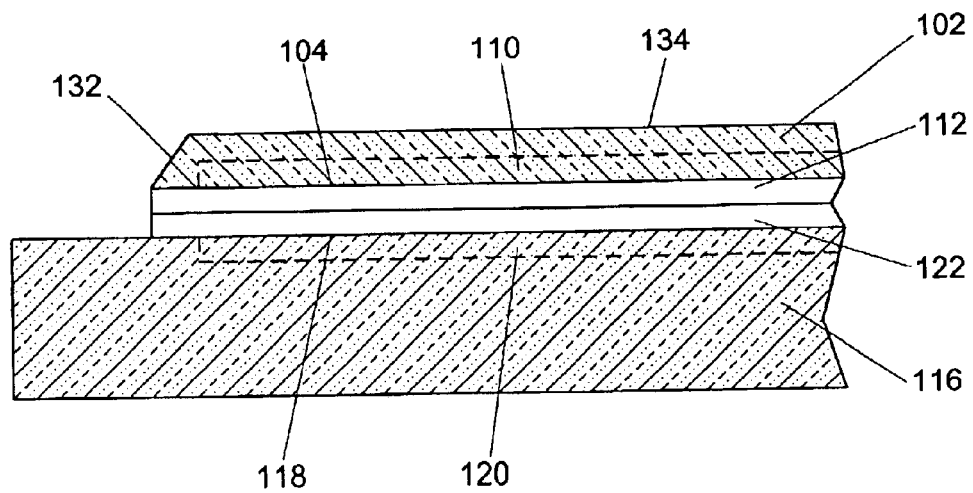
FIG. 6 illustrates a side cross-sectional view of the first microelectronic wafer of FIG. 4 having been thinned, according to the present invention.

After the removal of the first microelectronic wafer unsupported portion 140 (see FIGS. 2 and 3), the first microelectronic wafer 102 is thinned, as shown in FIG. 6, preferably to a thickness of between about 10 and 100 microns forming a first microelectronic wafer thinned back surface 134. The thinning of the first microelectronic wafer 102 may be carried our by any process known in the art, including but not limited to grinding (preferred), spin etching, and/or chemical mechanical polishing.

Figure 7:
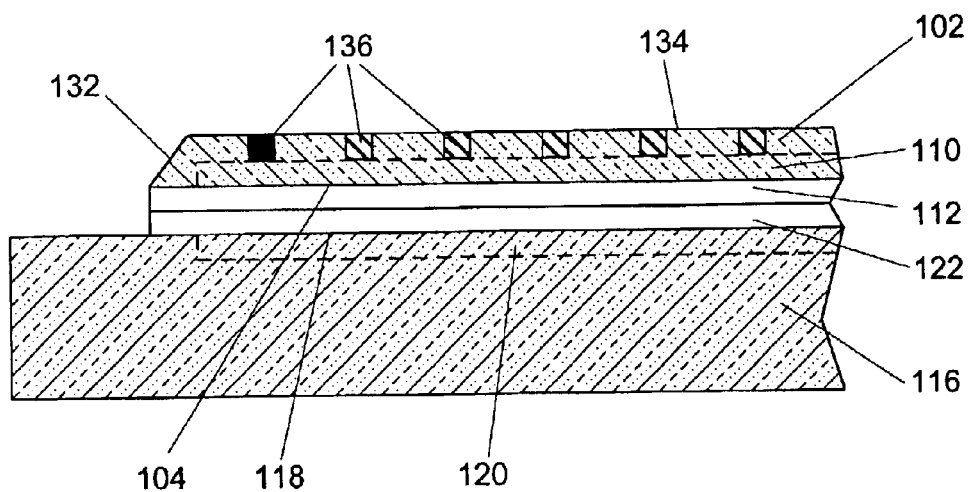
FIG. 7 illustrates a side cross-sectional view of a plurality of conductive vias formed through the first microelectronic wafer of FIG. 6 from a thinned back surface thereof to an integrated circuitry layer therein to make electrical connections therewith, according to the present invention.
Figure 8:
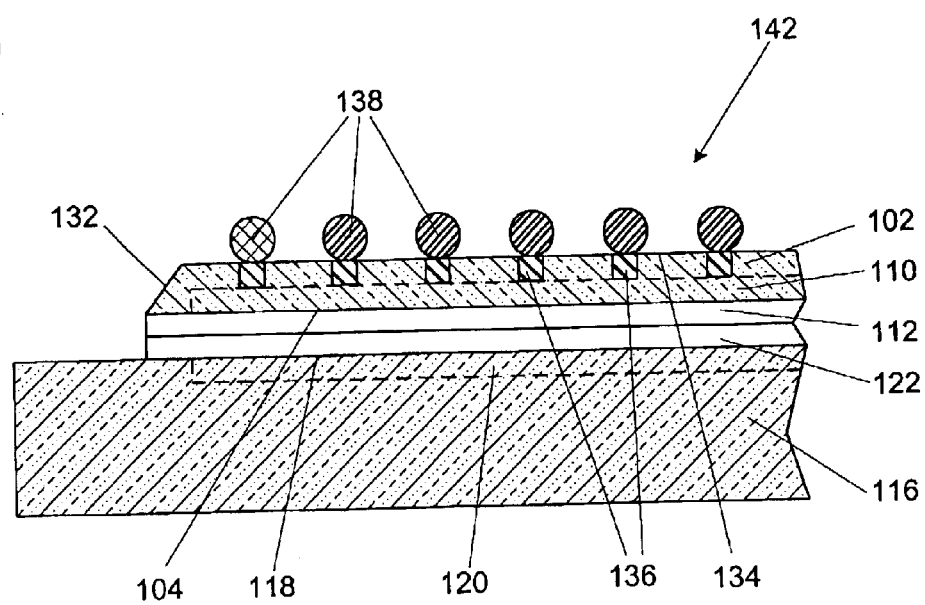
FIG. 8 illustrates a side cross-sectional view of a plurality of interconnect devices attached to the plurality of conductive vias of FIG. 7, according to the present invention.
Figure 9:
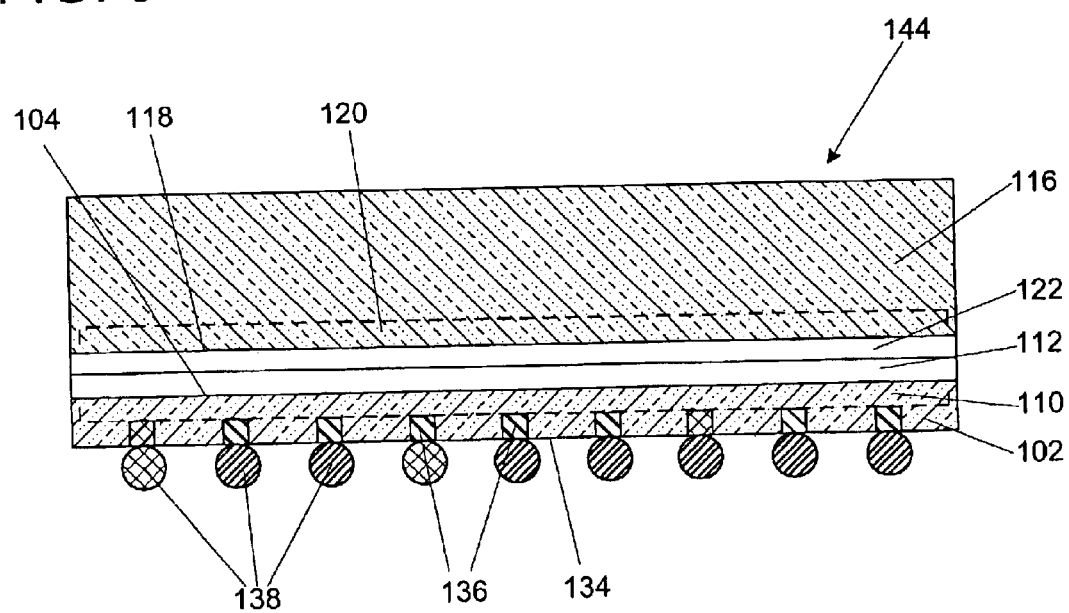
FIG. 9 illustrates a side cross-sectional view of a discrete microelectronic device formed from the dicing of the structure shown in FIG. 8, according to the present invention.
Figure 10:
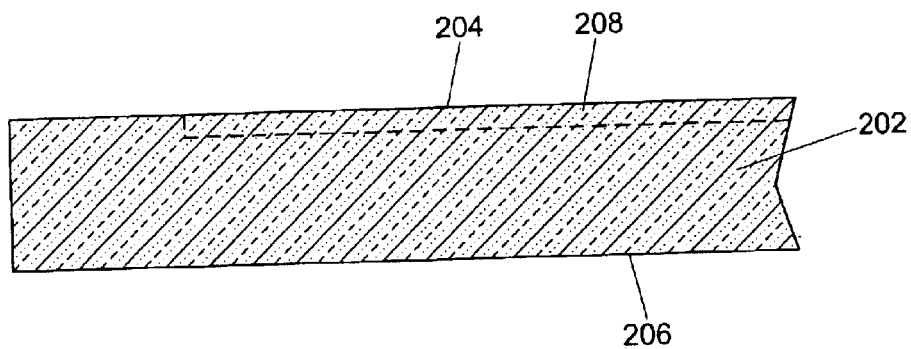
FIGS. 10–16 illustrate side cross-sectional views of a method of fabricating stacked microelectronic devices from a wafer-to-wafer stack, as known in the art.
Figure 11:
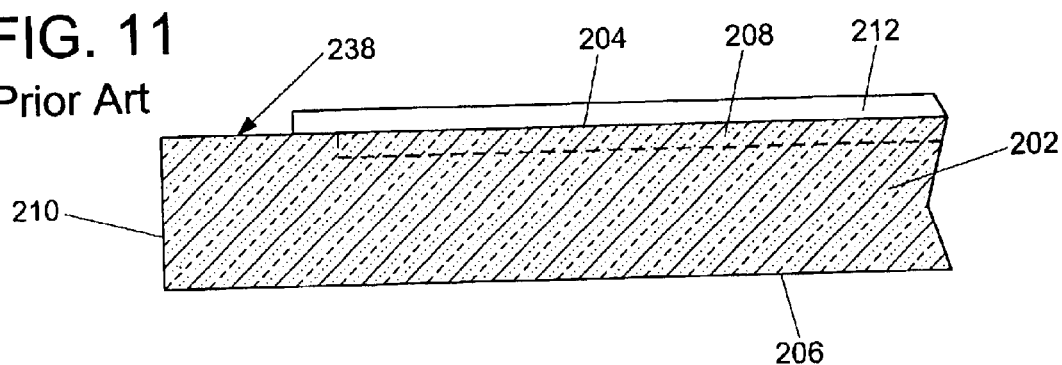
Figure 12:
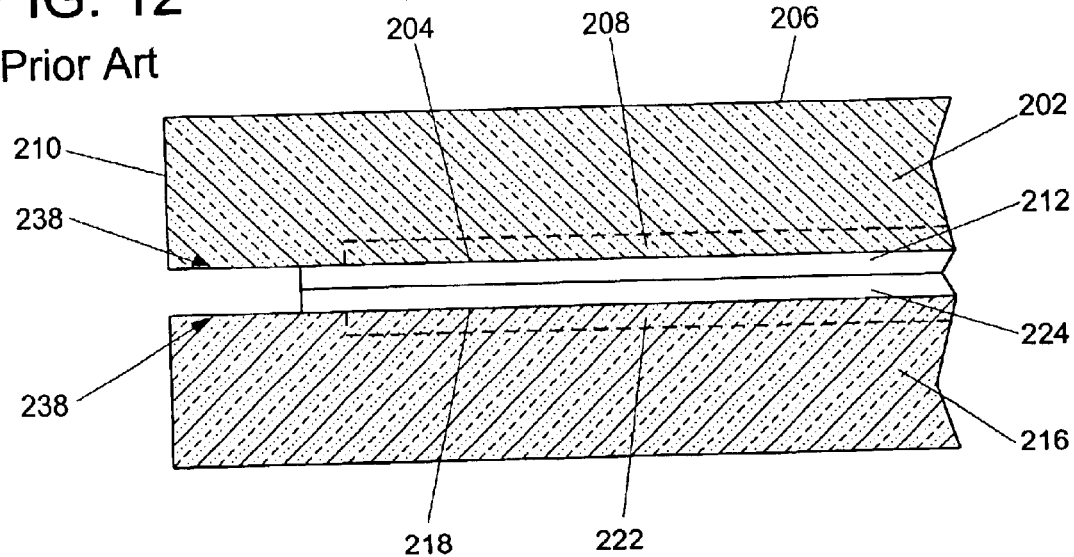
Figure 13:
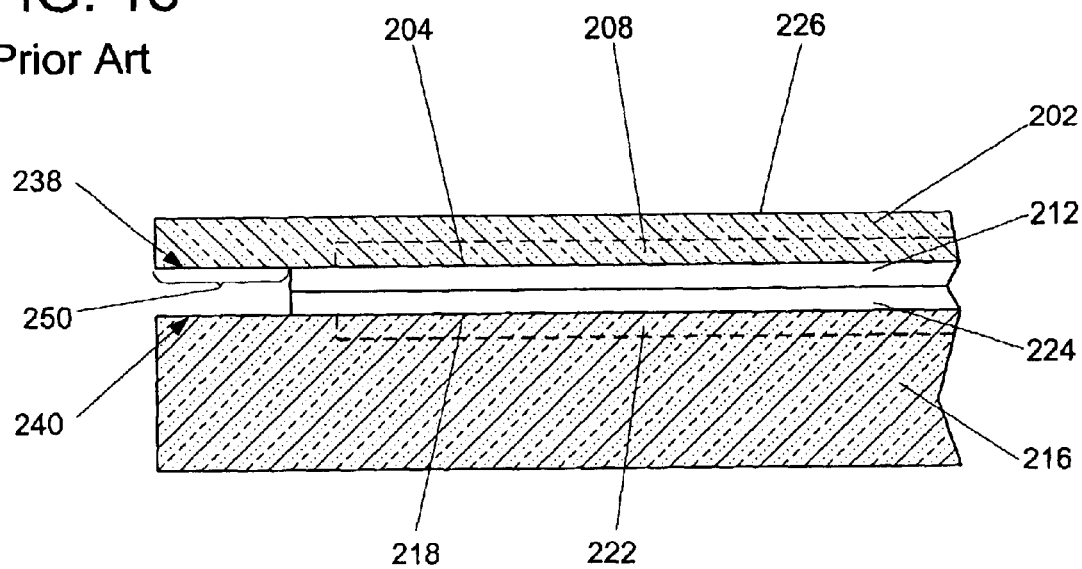
Figure 14:
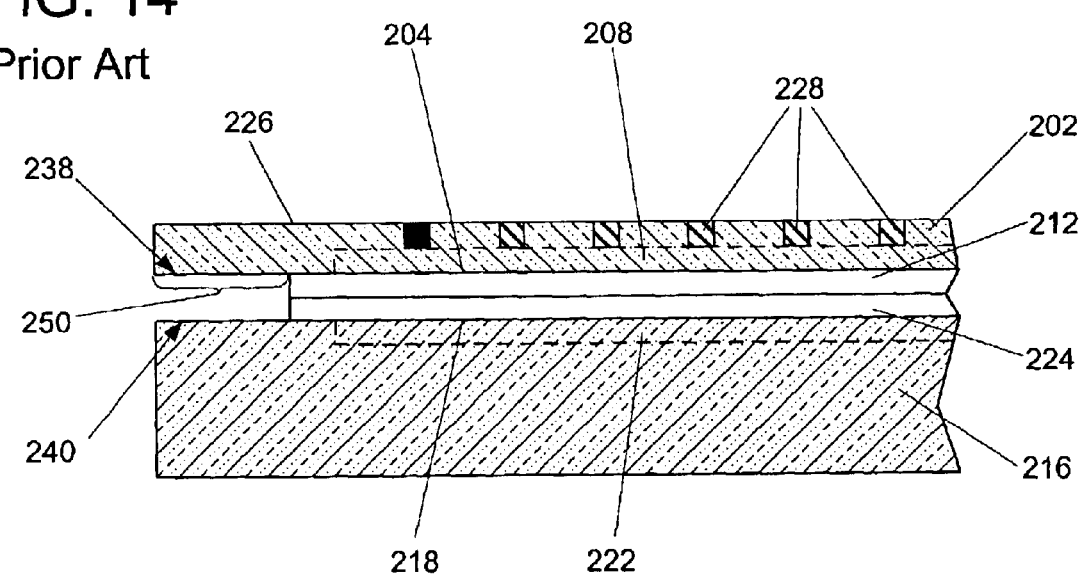
Figure 15:
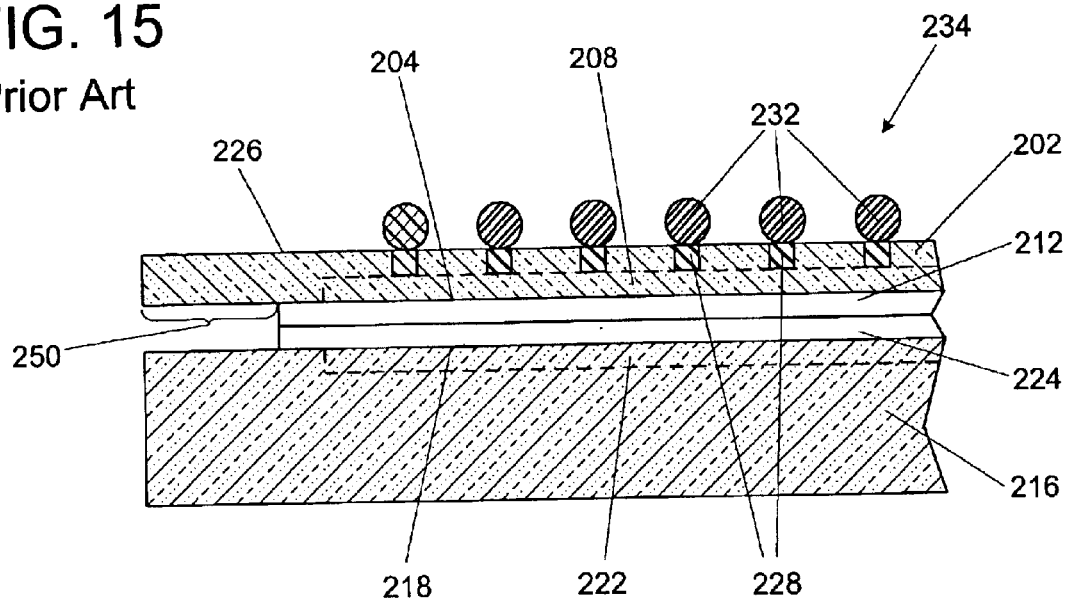
Figure 16:
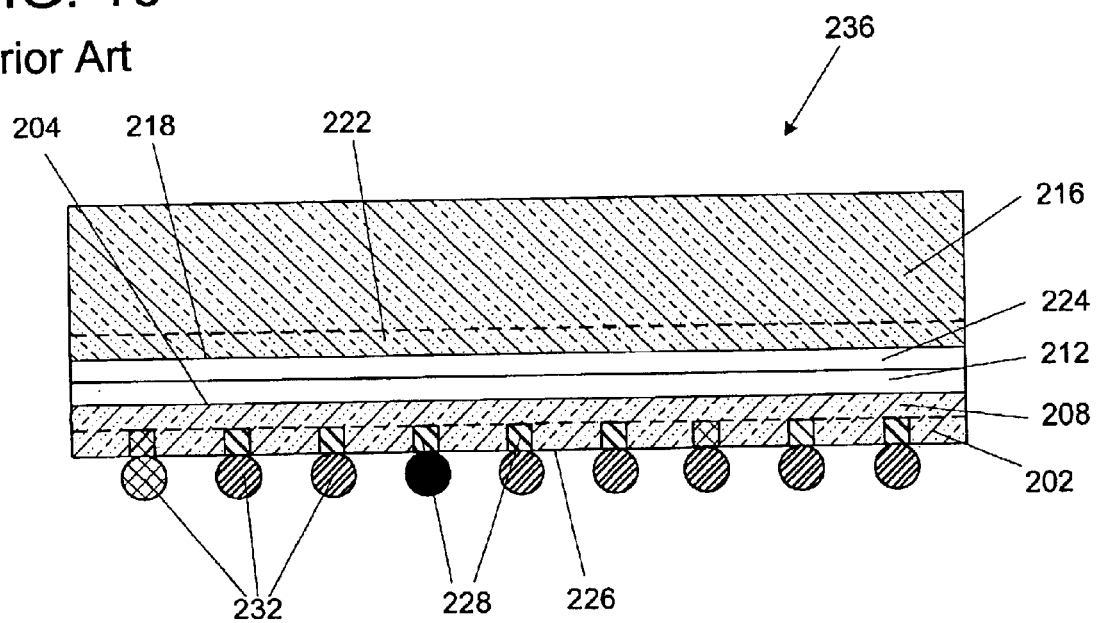
Figure 17:
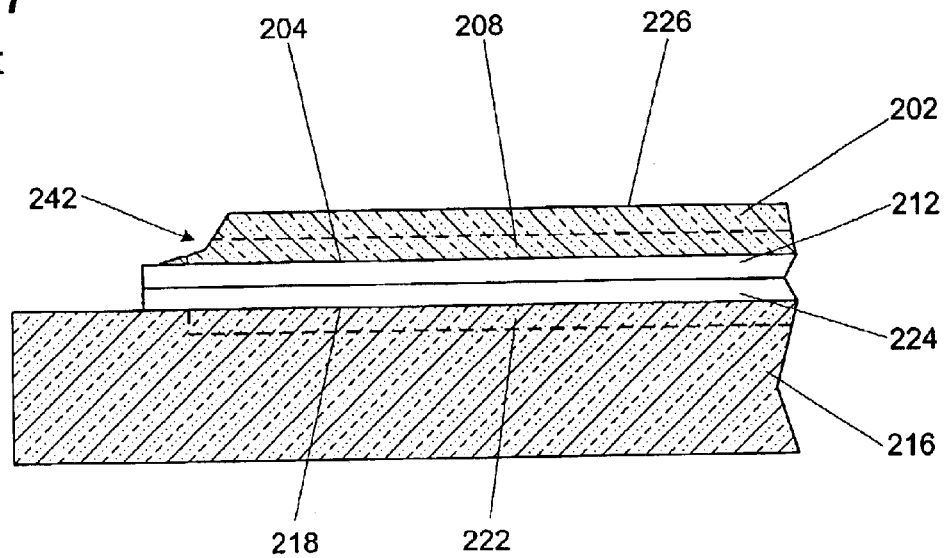
Figure 18:
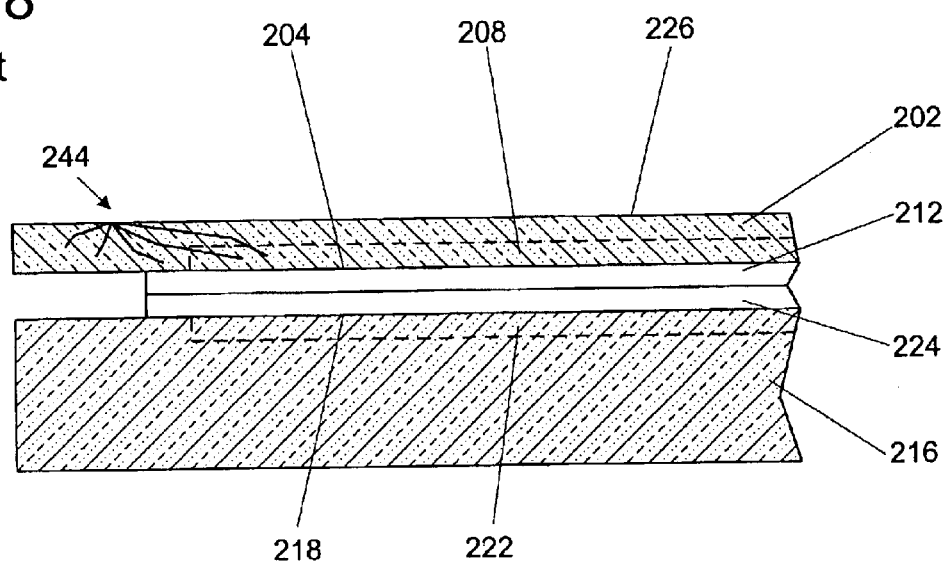
FIG. 18 illustrates a stacked wafer structure having a crack therein, as known in the art.

A plurality of conductive vias 136 are then formed to extend from the first microelectronic wafer thinned back surface 134 to the first microelectronic wafer integrated circuitry layer 110 to make electrical connections therewith, as shown in FIG. 7, by any known technique. A plurality of interconnect devices 138, such as solder balls, are then attached to the plurality of conductive vias 136 at the first microelectronic wafer thinned back surface 134, as shown in FIG. 8, to form a stacked wafer structure 142. The stacked wafer structure 142 may then be diced or singulated, such as with a wafer saw or a laser (not shown) to form a discrete microelectronic device 144, as shown in FIG. 9.

It is, of course, understood that rather than the plurality of interconnect devices 164 shown in FIG. 8, other structures could be formed, such as build-up layers (i.e., trace networks) or other such structures for the attachment of external devices.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A method of fabricating a stacked microelectronic device, comprising:

providing a stacked wafer structure including a first microelectronic wafer attached to a second microelectronic wafer by at least one interconnect layer extending between an active surface of the first microelectronic wafer and an active surface of the second microelectronic wafer, wherein an unsupported portion of said first microelectronic wafer is defined extending between all edge thereof and said at least one interconnect layer; and physically removing said first microelectronic wafer unsupported portion.

2. The method of claim 1, wherein physically removing said first microelectronic wafer unsupported portion comprises grinding away said first microelectronic wafer portion.

3. The method of claim 1, wherein physically removing said first microelectronic wafer unsupported portion comprises physically removing said first microelectronic wafer portion to form at least one abraded edge having a beveled angle of between about 0 to 60 degrees.

4. The method of claim 1, further comprising thinning said first microelectronic wafer to form a first microelectronic wafer thinned back surface.

5. The method of claim 4, wherein thinning said first microelectronic wafer comprises abrading a back surface of said first microelectronic wafer.

6. The method of claim 5, wherein abrading said first microelectronic wafer back surface is selected from the methods consisting of grinding, spin etching, and chemical mechanical polishing.

7. The method of claim 4, further comprising thinning said first microelectronic wafer to a thickness between about 10 and 100 microns.

8. The method of claim 4, further comprising forming at least one conductive via to extend from said first microelectronic wafer thinned back surface to an integrated circuitry layer proximate said first microelectronic wafer active surface.

9. The method of claim 8, further comprising disposing at least one interconnect device on said at least one conductive via.

10. A method of fabricating a stacked microelectronic device comprising:

providing a first microelectronic wafer having an active surface, a back surface, and at least one edge, said first microelectronic wafer further including an integrated circuitry layer extending from said first microelectronic wafer active surface into said first microelectronic wafer and an interconnect layer on said first microelectronic wafer active surface, wherein a portion of said first microelectronic wafer active surface extending from said at least one first microelectronic wafer edge has no interconnect layer thereon;

providing a second microelectronic wafer having an active surface and an integrated circuitry layer extending from said second microelectronic wafer active surface into said second microelectronic wafer and an interconnect layer on at least a portion of said second microelectronic wafer active surface;

attaching said first microelectronic wafer interconnect layer to said second microelectronic wafer interconnect layer; and physically removing said first microelectronic wafer portion.

11. The method of claim 10, wherein physically removing said first microelectronic wafer portion comprises grinding away said first microelectronic wafer portion.

12. The method of claim 10, wherein physically removing said first microelectronic wafer portion comprises physically removing said first microelectronic wafer portion to form at least one abraded edge having a beveled angle of between about 0 to 60 degrees.

13. The method of claim 10, wherein physically removing said first microelectronic wafer portion occurs after attaching said first microelectronic wafer interconnect layer to said second microelectronic wafer interconnect layer.

14. The method of claim 13, further comprising forming at least one conductive via to extend from said first microelectronic wafer thinned back surface to said first microelectronic wafer integrated circuitry layer.

15. The method of claim 14, further comprising disposing at least one interconnect device on said at least one conductive via.

16. The method of claim 10, further comprising thinning said first microelectronic wafer forming a first microelectronic wafer thinned back surface.

17. The method of claim 16, wherein thinning said first microelectronic wafer comprises abrading said first microelectronic wafer back surface.

18. The method of claim 17, wherein abrading said first microelectronic wafer back surface is selected from the methods consisting of grinding, spin etching, and chemical mechanical polishing.

19. The method of claim 16, further comprising thinning said first microelectronic wafer to a thickness between about 10 and 100 microns.

20. A method of fabricating a stacked microelectronic device comprising:

providing a first microelectronic wafer having an active surface, a back surface, and at least one edge, said first microelectronic wafer further including an integrated circuitry layer extending from said first microelectronic wafer active surface into said first microelectronic wafer and an interconnect layer on said first microelectronic wafer active surface, wherein a portion of said first microelectronic wafer active surface extending from said at least one first microelectronic wafer edge has no interconnect layer thereon;

providing a second microelectronic wafer having an active surface and an integrated circuitry layer extending from said second microelectronic wafer active surface into said second microelectronic wafer and an interconnect layer on at least a portion of said second microelectronic wafer active surface;

attaching said first microelectronic wafer interconnect layer to said second microelectronic wafer interconnect layer; and grinding away said first microelectronic wafer portion.

21. The method of claim 20, wherein grinding away said first microelectronic wafer portion comprises grinding said first microelectronic wafer portion to form at least one abraded edge having a beveled angle of between about 0 to 60 degrees.

22. The method of claim 20, further comprising thinning said first microelectronic wafer.

* * * * *

UNITED STATES PATENT AND TRADEMARK OFFICE
CERTIFICATE OF CORRECTION

PATENT NO.   : 6,790,748 B2
DATED        : September 14, 2004
INVENTOR(S)  : Kim et al.

It is certified that error appears in the above-identified patent and that said Letters Patent is hereby corrected as shown below:

<u>Column 4,</u>
Line 3, delete "10" and insert -- 110 --.

Signed and Sealed this

Thirty-first Day of May, 2005

JON W. DUDAS
*Director of the United States Patent and Trademark Office*